US008432702B2

(12) United States Patent
Hasegawa et al.

(10) Patent No.: US 8,432,702 B2
(45) Date of Patent: Apr. 30, 2013

(54) ELECTRONIC APPARATUS AND PRINTED WIRING BOARD (75) Inventors: Kenji Hasegawa, Hamura (JP); Tsuyoshi Kozai, Ome (JP); Terunari Kanou, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 9 days.

(21) Appl. No.: 13/032,546

(22) Filed: Feb. 22, 2011

(65) Prior Publication Data
US 2011/0141707 A1 Jun. 16, 2011

Related U.S. Application Data (63) Continuation of application No. 12/470,370, filed on May 21, 2009, now abandoned.

(30) Foreign Application Priority Data

Sep. 10, 2008 (JP) ................................. 2008-232390

(51) Int. Cl.
*H05K 5/02* (2006.01)
(52) U.S. Cl.
USPC ........... 361/753; 361/748; 361/752; 174/262; 174/263
(58) Field of Classification Search .................. 174/250, 174/255, 51, 261–266, 50; 361/799, 818, 361/816, 748–750, 752–753, 807; 257/690–692
See application file for complete search history.

(56) References Cited

U.S. PATENT DOCUMENTS

| 2,750,848 | A |   | 6/1956  | Boyer          |         |
|-----------|---|---|---------|----------------|---------|
| 3,883,305 | A |   | 5/1975  | Hoskins et al. |         |
| 4,400,594 | A |   | 8/1983  | Serras-Paulet  |         |
| 4,851,614 | A | * | 7/1989  | Duncan, Jr.    | 174/263 |
| 5,064,377 | A |   | 11/1991 | Wood           |         |
| 5,326,937 | A | * | 7/1994  | Watanabe       | 174/263 |
| 5,414,223 | A |   | 5/1995  | Suski et al.   |         |
| 5,420,378 | A | * | 5/1995  | Estes et al.   | 174/263 |
| 5,483,418 | A | * | 1/1996  | Hosoi          | 361/679.55 |

(Continued)

FOREIGN PATENT DOCUMENTS

| JP | U 60-151161 | 10/1985 |
| JP | 62-14497    | 1/1987  |

(Continued)

OTHER PUBLICATIONS

Notification of Reasons for Refusal mailed by Japan Patent Office on Aug. 11, 2009 in the corresponding Japanese patent application No. 2008-232390.

(Continued)

*Primary Examiner* — Angel R Estrada
*Assistant Examiner* — Dimary Lopez
(74) *Attorney, Agent, or Firm* — Knobbe Martens Olson & Bear LLP (57) ABSTRACT

According to an aspect of the present invention, there is provided a printed wiring board including: a substrate including an edge and a fixing hole located adjacent to the edge, the fixing hole configured to receive a bolt; and a land formed in a vicinity of the fixing hole and extending in at least a first direction and a second direction, the first direction being a direction from the fixing hole toward a center of the substrate, the second direction being direction along the edge.

15 Claims, 8 Drawing Sheets

U.S. PATENT DOCUMENTS

| | | | |
|---|---|---|---|
| 5,500,789 A * | 3/1996 | Miller et al. | 361/816 |
| 6,011,699 A | 1/2000 | Murray et al. | |
| 6,248,961 B1 | 6/2001 | Enroth et al. | |
| 6,295,210 B1 | 9/2001 | Lanzone et al. | |
| 6,706,964 B2 * | 3/2004 | Igarashi et al. | 174/359 |
| 6,894,220 B1 * | 5/2005 | Kozak et al. | 174/51 |
| 6,969,808 B2 * | 11/2005 | Shiraki | 174/255 |
| 7,088,591 B2 * | 8/2006 | Kishimoto et al. | 361/753 |
| 7,310,236 B2 | 12/2007 | Takahashi et al. | |
| 7,529,104 B2 * | 5/2009 | Ito | 361/800 |
| 7,898,820 B2 * | 3/2011 | Kao et al. | 361/807 |
| 7,965,517 B2 * | 6/2011 | Mayumi et al. | 361/753 |
| 2006/0021793 A1 | 2/2006 | Aoki | |
| 2007/0171136 A1 | 7/2007 | Mitsui | |
| 2011/0033813 A1 | 2/2011 | Baughman et al. | |

FOREIGN PATENT DOCUMENTS

| | | |
|---|---|---|
| JP | H02-010791 | 1/1990 |
| JP | 03-175698 | 7/1991 |
| JP | U 04-15865 | 2/1992 |
| JP | 05-283823 | 10/1993 |
| JP | H10-270811 | 10/1998 |
| JP | H10-313154 | 11/1998 |
| JP | H11-317570 A | 11/1999 |
| JP | 2000-244080 A | 9/2000 |
| JP | 2000-349420 | 12/2000 |
| JP | 2003-309333 | 10/2003 |
| JP | 2006-041409 A | 2/2006 |

OTHER PUBLICATIONS

Notification of Reasons for Refusal mailed by Japan Patent Office on Nov. 10, 2009 in the corresponding Japanese patent application No. 2008-232390.

Explanation of Non-English Language Reference(s).

* cited by examiner

ELECTRONIC APPARATUS AND PRINTED WIRING BOARD

CROSS-REFERENCE TO RELATED APPLICATIONS

This application is a continuation of U.S. patent application Ser. No. 12/470,370 filed May 21, 2009, which is based upon and claims the benefit of priority from Japanese Patent Application No. 2008-232390, filed on Sep. 10, 2008, the entire contents of both which are incorporated herein by reference.

BACKGROUND

1. Field

An aspect of the present invention relates to a printed wiring board having lands and an electronic apparatus equipped with it.

2. Description of the Related Art

For example, a printed wiring board is disclosed in which lands for grounding are disposed around fixing holes for bolting of the printed wiring board. This printed wiring board is equipped with a substrate, the fixing holes which penetrate through the substrate, the lands which are donut-shaped and are formed around the respective fixing holes on the surface of the substrate, and cream solder members which are printed on the surfaces of the lands.

In printed wiring boards of this type, usually, the surfaces of the lands are subjected to solder plating to prevent corrosion of the lands and attain reliable grounding. A printed wiring board having a cost advantage over ones in which the lands are subjected to solder plating is provided by supplying solder also to the land surfaces when cream solder is supplied to mounting patterns of other components (see JP-A-2000-244080, for instance).

In recent years, with the increase in miniaturization and functionality of digital equipment, the high-density mounting on a printed wiring board and the securing of a wide mounting area have come to be required increasingly. However, the above donut-shaped lands raise a problem that the mounting area on the printed wiring board is reduced by areas corresponding to the spaces for formation of the lands. For another thing, to secure a wide mounting area on a printed wiring board, it is effective to locate the fixing holes as close to the outer periphery of the board as possible. However, in the printed wiring boards, the fixing holes cannot be located sufficiently close to the outer periphery because margins for formation of the donut-shaped lands need to be secured around the respective fixing holes.

Each of these margins needs to be set taking into consideration not only the space for formation of the land but also a variation that may occur when a land pattern is formed by etching. This is because if a land is formed in contact with the periphery the land is exposed in an end face of the printed wiring board, as a result of which the printed wiring board may be short-circuited with another component. This also requires sufficient margins around the respective fixing holes.

On the other hand, one method for reducing the above margins is to narrow the widths of the donut-shaped lands. However, if the land widths are narrowed, a land pattern may be disconnected due to a variation in forming the pattern. Furthermore, since the lands are reduced in strength, the land patterns are prone to peel off when bolting is performed through the fixing holes.

For the above reasons, the printed wiring boards cannot sufficiently satisfy the recent requirements of high-density mounting and securing of a wider mounting area.

SUMMARY

According to an aspect of the invention, there is provided a printed wiring board including: a substrate including an edge and a fixing hole located adjacent to the edge, the fixing hole configured to receive a bolt; and a land formed in a vicinity of the fixing hole and extending in at least a first direction and a second direction, the first direction being a direction from the fixing hole toward a center of the substrate, the second direction being direction along the edge.

BRIEF DESCRIPTION OF THE SEVERAL VIEWS OF THE DRAWINGS

A general architecture that implements the various feature of the present invention will now be described with reference to the drawings. The drawings and the associated descriptions are provided to illustrate embodiments of the present invention and not to limit the scope of the present invention.

DETAILED DESCRIPTION

Figure 1:
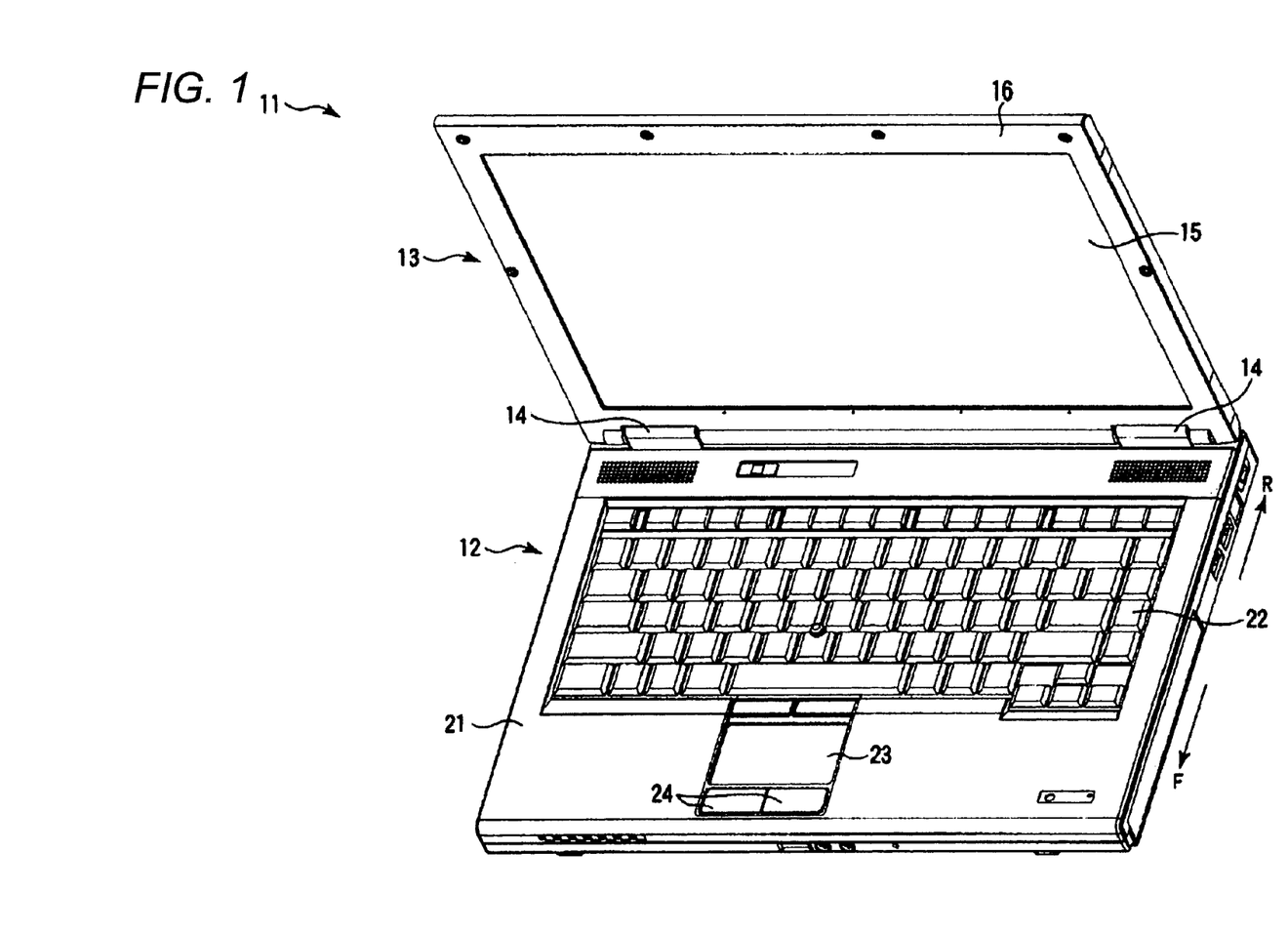
FIG. 1 is an exemplary perspective view of a portable computer according to a first embodiment.

An electronic apparatus according to a first embodiment will be described below with reference to FIGS. 1 to 4. As shown in FIG. 1, a portable computer as an example electronic apparatus is a so-called notebook personal computer. A description will be made with a notation that the forward direction and the backward direction are denoted by arrows F and R, respectively.

As shown in FIG. 1, the portable computer 11 is equipped with a main body unit 12, a display unit 13, and hinge mechanisms 14 which connect the main body unit 12 and the display unit 13. Supporting the display unit 13, the hinge mechanisms 14 make it possible to rotate the display unit 13 with respect to the main body unit 12. The display unit 13 has a display 15 and a cover 16 surrounding the display 15. The display 15 is a liquid crystal display, for example.

Figure 2:
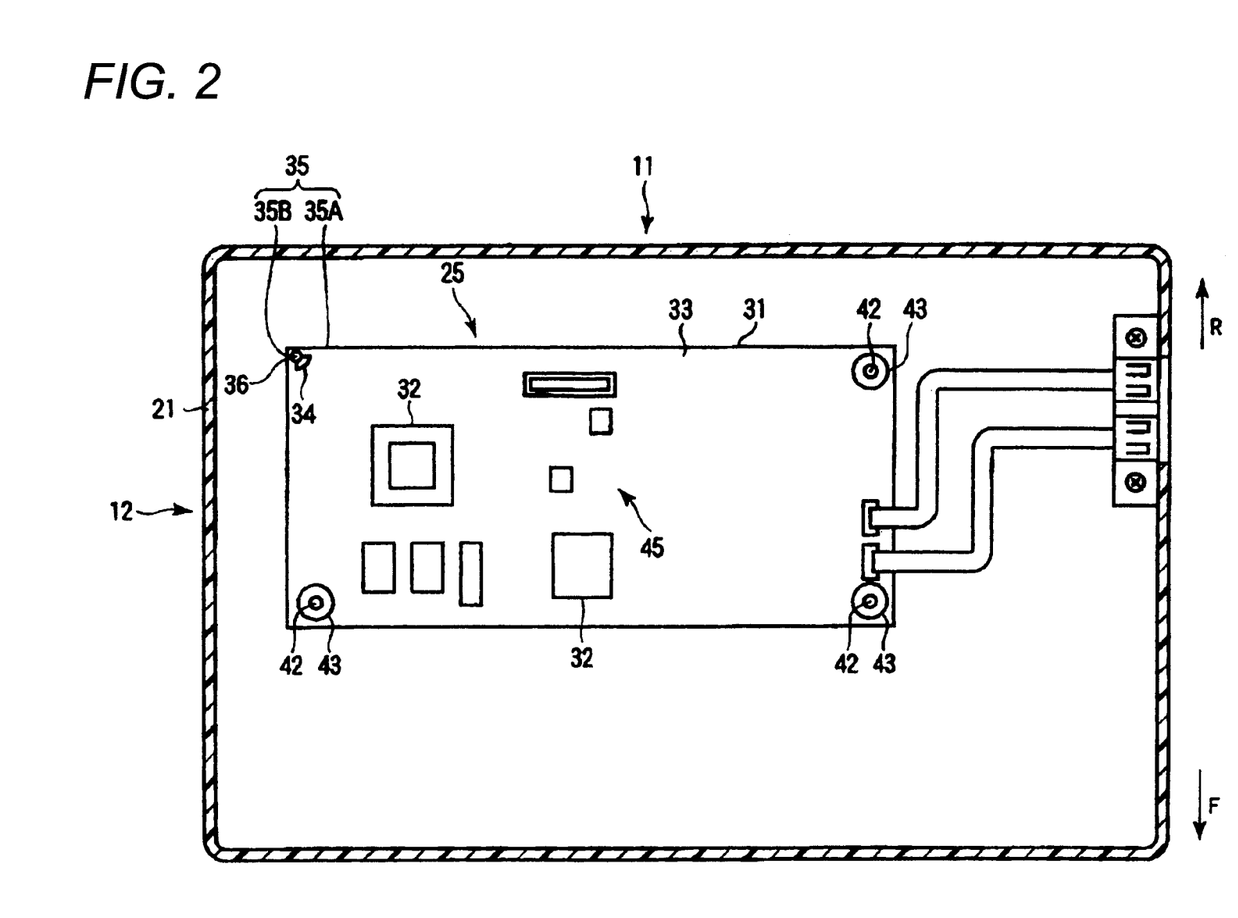
FIG. 2 is an exemplary sectional view, taken in a horizontal plane, of a main body unit of the portable computer shown in FIG. 1.
Figure 4:
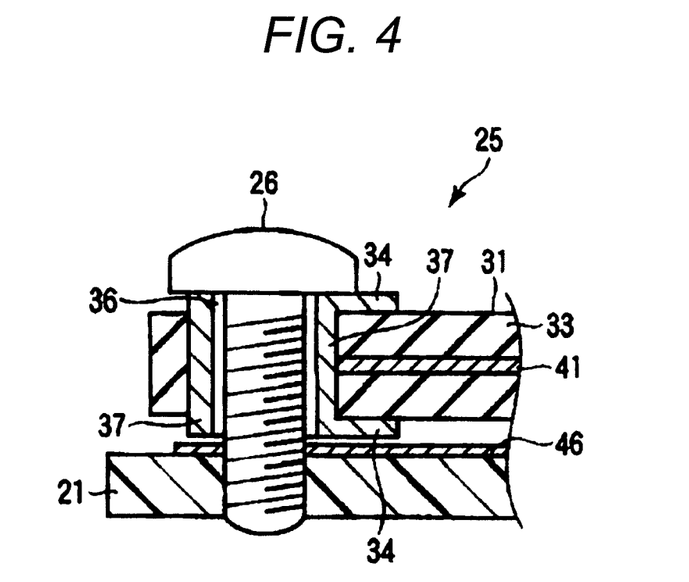
FIG. 4 is an exemplary sectional view, taken in a vertical plane, of the printed wiring board shown in FIG. 3.

The main body unit 12 has a casing 21 made of a synthetic resin, a keyboard 22, a touch pad 23 which is a pointing device, and buttons 24. As shown in FIGS. 2 and 4, the main body unit 12 also has, inside the casing 21, a printed circuit board 25 and bolts 26 for fixing of the printed circuit board 25 to the casing 21. The printed circuit board 25 has a printed wiring board 31 and plural circuit components 32 which are mounted on the printed wiring board 31. The plural circuit components 32 include a CPU and a north bridge. The bolts 26 are not illustrated in FIG. 2. The inside surfaces of the casing 21 are uniformly covered with a conductive ground layer 46. The ground layer 46 prevents outward leakage of electromagnetic waves from the portable computer 11.

Figure 3:
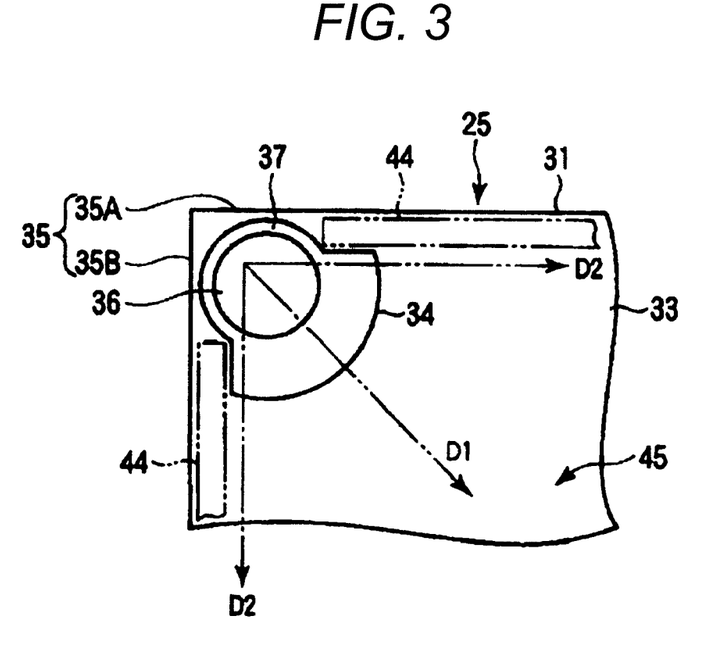
FIG. 3 is an exemplary plan view of a printed wiring board which is housed in a casing of the main body unit shown in FIG. 2.

For example, the printed wiring board 31 is a copper-clad lamination plate in which plural copper wiring layers are laminated. The printed wiring board 31 has a substrate 33 and a land 34 which is formed on the substrate 33. The substrate 33 is formed by alternately laminating insulating layers (base members) made of a glass-cloth-incorporated resin and wiring layers sandwiched between the insulating layers. The substrate 33 has a first edge 35A and a second edge 35B which define part of the periphery of the substrate 33, a fixing hole 36 which is located adjacent to the first edge 35A and the second edge 35B, and a conductive plating member 37 which covers the inside surface of the fixing hole 36. The fixing hole 36 is located as close to the first edge 35A and the second edge 35B as possible.

As shown in FIGS. 3 and 4, the plating member 37 is made of a metal material, assumes a cylindrical shape, and is electrically connected to a ground member 41 which is disposed inside the substrate 33. The plating member 37 is continuous with and is electrically connected to the land 34. The ground member 41 is grounded to the ground layer 46 via the plating member 37 and the bolt 26.

The substrate 33 has, in addition to the fixing hole 36, through-holes 42 for bolting of the printed wiring board 31 to the casing 21. A second land 43 having a conventional shape (i.e., a donut shape) is formed around the opening of each through-hole 42. When the printed circuit wiring 31 is fixed to the casing 21, the bolts 26 are inserted through the fixing hole 36 and the through-holes 42.

The substrate 33 has, on its top surface, a pair of first regions 44 which extend along the respective edges 35 so as to assume band shapes. The land 34 is formed around (in a vicinity of) the fixing hole 36. The land 34 extends from the fixing hole 36 in a range that is defined between a direction D1 from the fixing hole 36 toward a central portion 45 of the substrate 33 and directions D2 along the respective edges 35. That is, the land 34 is sector-shaped and is formed so as to extend toward the central portion 45 of the substrate 33. An angle of the sector shape of the land 34 is about 90 degrees. The land 34 is positioned outside the first regions 44. For example, the land 34 is formed into the sector shape by etching the surface copper foil layer of the substrate 33.

Figure 5:
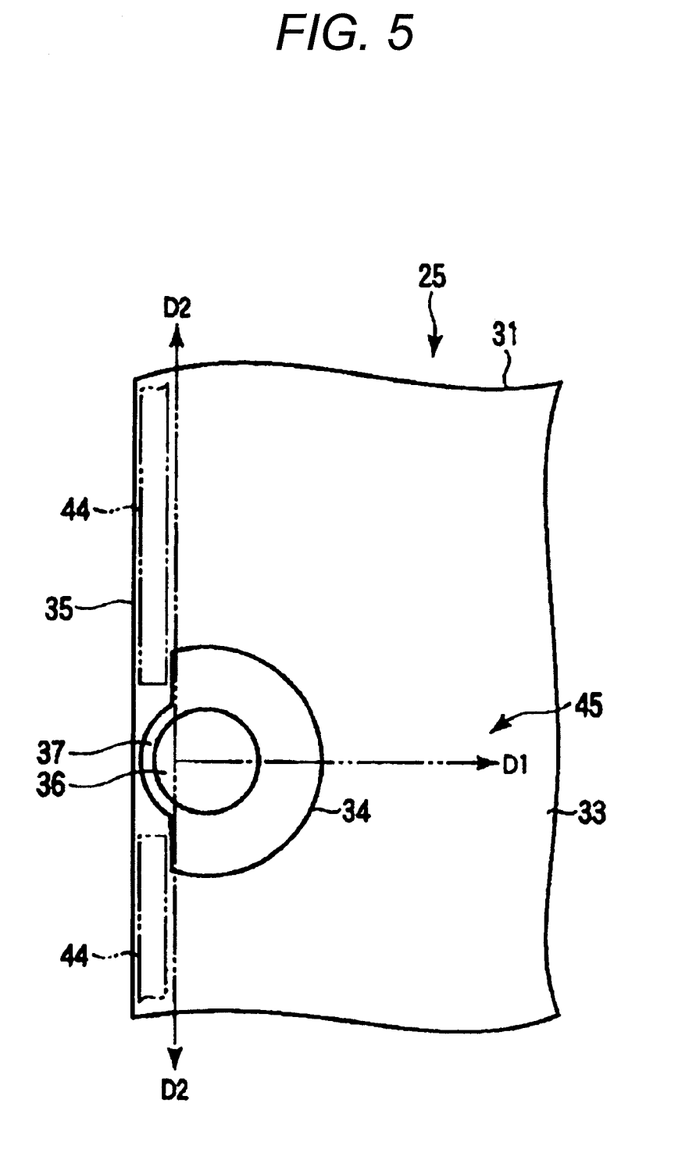
FIG. 5 is an exemplary plan view of a printed wiring board of a portable computer according to a modification of the first embodiment.

Although in the embodiment the plural through-holes 42 and the one fixing hole 36 are provided, the invention is not limited to such a case; plural fixing holes 36 may be provided so as to replace part of the through-holes 42. In the embodiment, the fixing hole 36 is located adjacent to the two edges 35A and 35B, that is, the corner edge, of the printed wiring board 31 and the sector-shape angle of the land 34 is equal to about 90 degrees. However, the invention is not limited to such a case. As shown in FIG. 5, the fixing hole 36 may be located adjacent to one edge 35 of the printed wiring board 31, in which case the sector-shape angle of the land 34 is equal to about 180 degrees (described later in detail).

In the first embodiment, the printed wiring board 31 is equipped with the substrate 33 having the edges 35 which define part of the periphery of the printed wiring board 31 and the fixing hole 36 which is located adjacent to the edges 35 and through which the bolt 26 is inserted and the land 34 which is formed around the fixing hole 36 and extends outward from the fixing hole 36 in the range that is defined between the direction D1 going from the fixing hole 36 toward the central portion 45 of the substrate 33 and the directions D2 that are along the edges 35.

With this structure, the land 34 is formed along the direction D1 which goes toward the central portion 45 of the substrate 33 and the land 34 is not formed between the fixing hole 36 and the edges 35. As a result, no space for formation of the land 34 is required between the fixing hole 36 and the edges 35 and hence the fixing hole 36 can be located as close to the edges 35 as possible. Therefore, a wide mounting area can be secured on the printed wiring board 31, which makes it possible to cope with the miniaturization of the printed wiring board 31 flexibly. Furthermore, since the land 34 need not be formed narrowly, a land pattern can be made sufficiently strong. This prevents a phenomenon that the land 34 is so weak that its pattern peels off when the bolt 26 is inserted through the fixing hole 36 for the purpose of fixing. Another problem can be prevented that a pattern of the land 34 is disconnected halfway when it is formed by etching.

The land 34 is formed outside the band-shaped first regions 44 which extend along the edges 35. This structure prevents a problem that the land 34 is deviated to be exposed in an end face of the printed wiring board 31. This makes it possible to locate the fixing hole 36 even closer to the edges 35. Therefore, an even wider mounting area can be secured on the printed wiring board 31.

The land 34 has the sector shape whose virtual apex is located in the fixing hole 36, and extends toward the central portion 45. With this structure, the land 34 is given sufficient strength though it is simple in shape. In particular, since the land 34 has the sector shape, the head of the bolt 26 can easily be brought into contact with the land 34, whereby the printed wiring board 31 can be grounded to the ground layer 46 of the casing 21 reliably.

In the embodiment, the printed wiring board 31 is provided with the conductive plating member 37 which covers the inside surface of the fixing hole 36 and is continuous with the land 34. With this structure, the contact area between the bolt 26 and the land 34/plating member 37 is increased, whereby the printed wiring board 31 can be grounded to the ground layer 46 of the casing 21 more reliably.

A modification of the portable computer 11 according to the first embodiment will be described below with reference to FIG. 5 (differences will be described mainly). In FIG. 5, members having the same members in the first embodiment are given the same reference symbols as the latter.

As shown in FIG. 5, a printed wiring board 31 has a substrate 33 and a land 34 which is formed on the substrate 33. The substrate 33 has an edge 35 which defines part of the periphery of the substrate 33, a fixing hole 36 which is located adjacent to the edge 35, and a conductive plating member 37 which covers the inside surface of the fixing hole 36. The fixing hole 36 is located as close to the edge 35 as possible.

The substrate 33 has, on its top surface, a pair of first regions 44 which extend along the edge 35 so as to assume band shapes. The land 34 is formed around (in the vicinity of) the fixing hole 36. The land 34 extends outward from the fixing hole 36 in a range that is defined between a direction D1 going from the fixing hole 36 toward a central portion 45 of the substrate 33 and directions D2 that are along the edge 35.

That is, the land 34 is sector-shaped and is formed so as to extend toward the central portion 45 of the substrate 33. The angle of the sector shape of the land 34 is about 180 degrees. The land 34 is disposed outside the first regions 44.

According to the modification of the first embodiment, a wide mounting area can be secured on the printed wiring board 31 even in the case where the fixing hole 36 is located in the vicinity of one edge 35. Furthermore, since the land 34 does not overlap with the band-shaped first regions 44 which extend along the edge 35, a phenomenon that the land 34 is deviated to be exposed in an end face of the printed wiring board 31 can be prevented.

Figure 6:
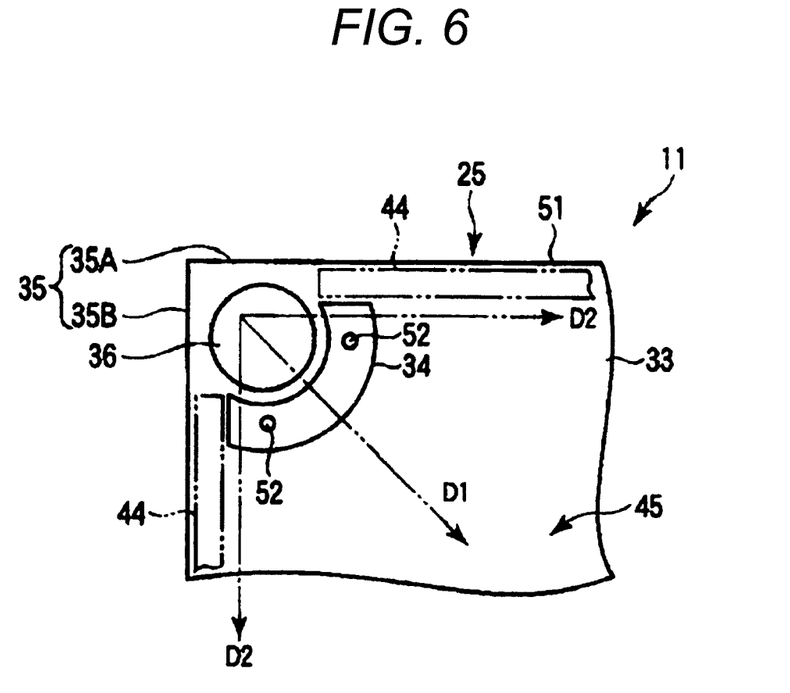
FIG. 6 is an exemplary plan view of a printed wiring board of a portable computer according to a second embodiment.
Figure 7:
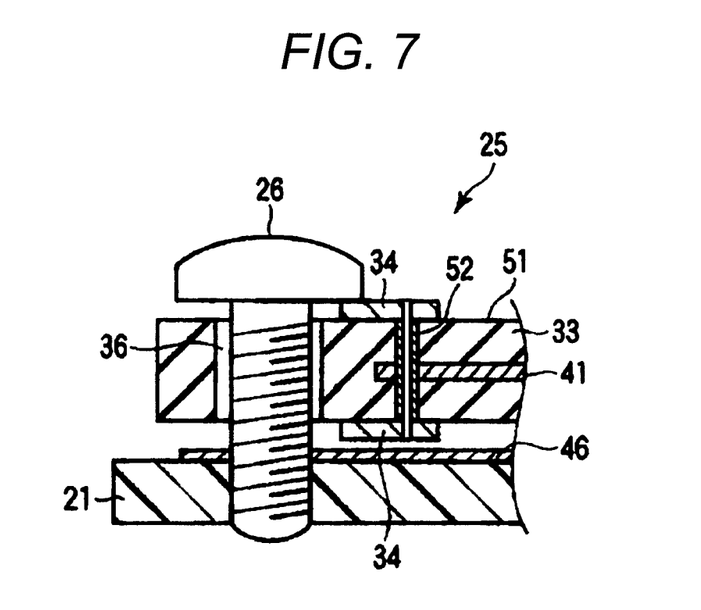
FIG. 7 is an exemplary sectional view, taken in a vertical plane, of the printed wiring board shown in FIG. 6.

Next, a portable computer according to a second embodiment will be described with reference to FIGS. 6 and 7. The portable computer 11 as an example electronic apparatus according to the second embodiment is the same as that according to the first embodiment except that a printed wiring board 51 is not provided with the plating member 37 and through-hole plating members 52 which connect a land 34 to the ground member 41 are provided separately from a fixing hole 36. Therefore, members that are different than in the first embodiment will mainly be described below, and members having the same members in the first embodiment will be given the same reference symbols as the latter and will not be described.

The printed wiring board 51 of the portable computer according to the second embodiment has a substrate 33, the land 34 which is formed on the substrate 33, and the through-hole plating members 52 which connect the land 34 to the ground member 41. The through-hole plating members 52 are separate from the fixing hole 36. The substrate 33 has, on its top surface, a pair of first regions 44 which extend along edges 35 so as to assume band shapes. The land 34 is formed around (in the vicinity of) the fixing hole 36. The land 34 extends outward from the fixing hole 36 in a range that is defined between a direction D1 going from the fixing hole 36 toward a central portion 45 of the substrate 33 and directions D2 that are along the edges 35. That is, the land 34 is sector-shaped and is formed so as to extend toward the central portion 45 of the substrate 33. The angle of the sector shape of the land 34 is about 90 degrees. The land 34 does not overlap with the first regions 44.

According to the second embodiment, a wide mounting area can be secured on the printed wiring board 51 as in the first embodiment even in the case where the plating member 37 is not provided. Furthermore, a manufacturing process can be made simpler than in the printed wiring board 31 according to the first embodiment by a degree corresponding to the elimination of the plating member 37.

Figure 8:
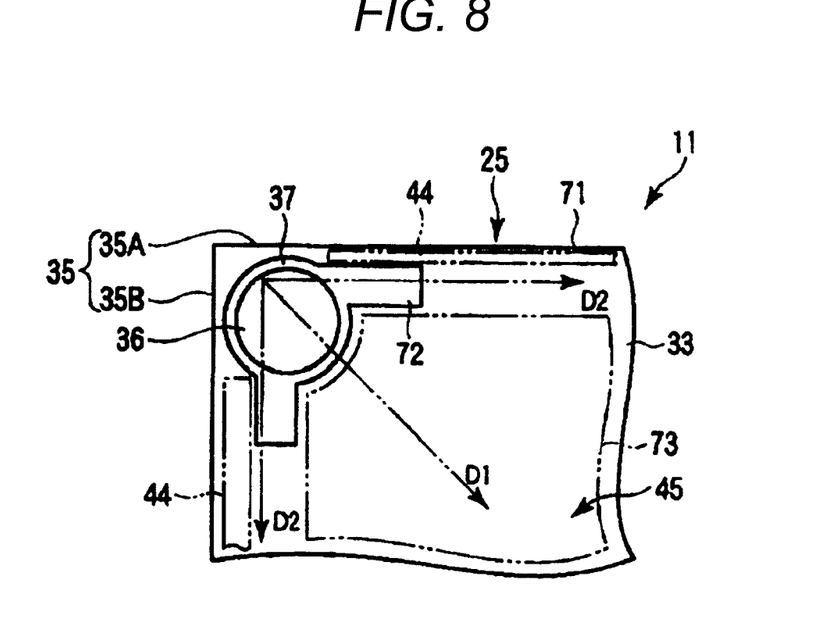
FIG. 8 is an exemplary plan view of a printed wiring board of a portable computer according to a third embodiment.

Next, a portable computer according to a third embodiment will be described with reference to FIG. 8. The portable computer 11 as an example electronic apparatus according to the third embodiment is the same as that according to the first embodiment except for the shape of a land 72 of a printed wiring board 71. Therefore, members that are different than in the first embodiment will mainly be described below, and members having the same members in the first embodiment will be given the same reference symbols as the latter and will not be described.

The printed wiring board 71 of the portable computer 11 according to the third embodiment has a substrate 33 and the land 72 which is formed on the substrate 33. The substrate 33 has, on its top surface, a pair of first regions 44 which extend along edges 35 so as to assume band shapes. The land 72 is formed around (in the vicinity of) the opening of a fixing hole 36. The land 72 extends outward from the fixing hole 36 in a range that is defined between a direction D1 going from the fixing hole 36 toward a central portion 45 of the substrate 33 and directions D2 that are along the edges 35. The land 72 is disposed outside the first regions 44 or a second region 73 that is located between the fixing hole 36 and the central portion 45. More specifically, the land 72 extends outward from the fixing hole 36 in two directions that are along the edges 35 so as to generally assume an L shape as a whole. The land 72 is continuous with a plating member 37.

In the third embodiment, the land 72 is disposed outside the second region 73 which is located between the fixing hole 36 and the central portion 45. With this structure, the second region 73 can be used as a mounting area; for example, interconnections and circuit components can be disposed in the second region 73. Therefore, a wider mounting area can be secured on the printed wiring board 71 than even on the printed wiring board 31 of the first embodiment. Furthermore, since a pattern of the land 72 is formed by, for example, etching a copper foil, the manufacturing process is not made more complex than in the first embodiment.

Figure 9:
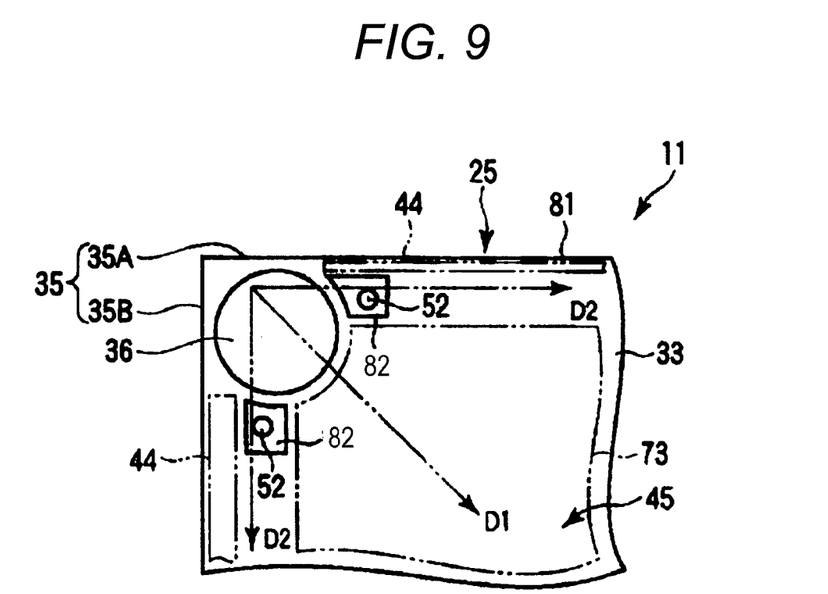
FIG. 9 is an exemplary plan view of a printed wiring board of a portable computer according to a fourth embodiment.

Next, a portable computer according to a fourth embodiment will be described with reference to FIG. 9. The portable computer 11 as an example electronic apparatus according to the fourth embodiment is the same as that according to the second embodiment except for the shape of lands 82 of a printed wiring board 81. Therefore, members that are different than in the second embodiment will mainly be described below, and members having the same members in the second embodiment will be given the same reference symbols as the latter and will not be described.

The printed wiring board 81 of the portable computer 11 according to the fourth embodiment has a substrate 33, the lands 82 which are formed on the substrate 33, and through-hole plating members 52 which connect the respective lands 82 to a ground member 41. The substrate 33 has, on its top surface, a pair of first regions 44 which extend along edges 35 so as to assume band shapes. The lands 82 are formed around (in the vicinity of) the opening of a fixing hole 36. The lands 82 extend outward from the fixing hole 36 in a range that is defined between a direction D1 going from the fixing hole 36 toward a central portion 45 of the substrate 33 and directions D2 that are along the edges 35. The lands 82 are disposed outside the associated first regions 44.

The land 82 is located outside a second region 73 that is located between the fixing hole 36 and the central portion 45. More specifically, the lands 72 extend outward from the fixing hole 36 in two respective directions that are along the edges 35. In this embodiment, the lands 82 are disposed separately at the two positions around the fixing hole 36.

In the fourth embodiment, the lands 82 do not overlap with the second region 73 which is located between the fixing hole 36 and the central portion 45. With this structure, as in the third embodiment, a wider mounting area can be secured on the printed wiring board 81 than even on the printed wiring board 51 of the second embodiment. Furthermore, the manufacturing process is not made more complex than in the second embodiment even if the lands 82 have the above-described shapes.

Figure 10:
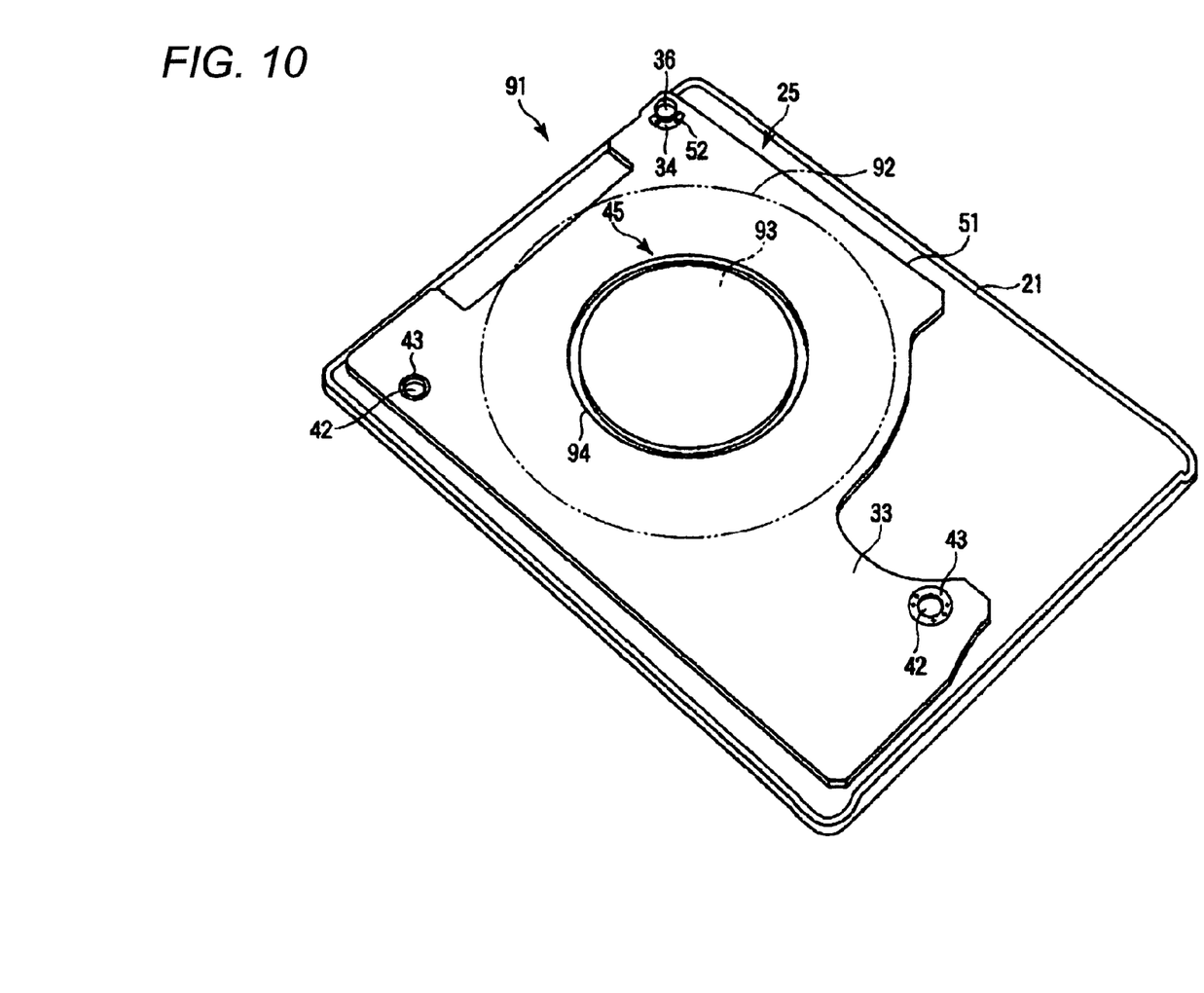
FIG. 10 is an exemplary perspective view of a printed wiring board which is housed in a casing of a hard disk drive according to a fifth embodiment.
Figure 11:
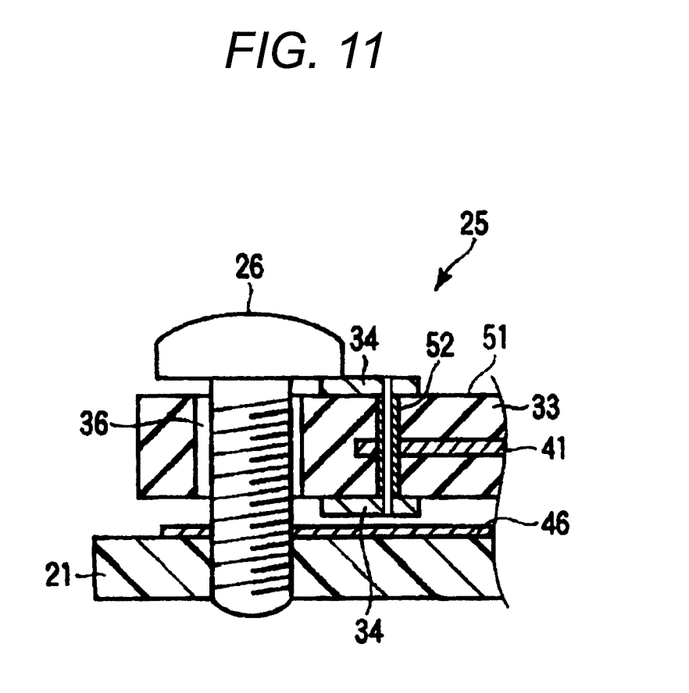
FIG. 11 is an exemplary sectional view, taken in a vertical plane, of the printed wiring board shown in FIG. 10.

Next, an electronic apparatus according to a fifth embodiment will be described with reference to FIGS. 10 and 11. The fifth embodiment is directed to a case that the invention is applied to a hard disk drive 91 which is an example electronic apparatus. Although individual components of the hard disk drive are different in structure than in the first to fourth embodiments, the structure of a printed wiring board 51 is approximately the same as in the second embodiment. Therefore, members that are different than in the second embodiment will mainly be described below, and members having the same members in the second embodiment will be given the same reference symbols as the latter and will not be described.

The hard disk drive 91 is equipped with a casing 21, a printed circuit board 25 which is housed in the casing 21, a housing 92 which houses plural disks, a spindle motor 93 for rotationally driving the plural disks, and other components. The hard disk drive 91 also has bolts 26 (not shown in FIG. 10) for fixing of the printed circuit board 25 to the casing 21. The printed circuit board 25 has the printed wiring board 51 and plural circuit components (not shown in FIGS. 10 and 11) which are disposed on the printed wiring board 51.

The printed wiring board 51 is different from that of the second embodiment in that the former has an opening 94 where the spindle motor 93 is disposed, they are the same in structure in the other points. A substrate 33 of the printed wiring board 51 has one fixing hole 36 around which a sector-shaped land 34 is formed and two through-holes 42 around which donut-shaped second lands 43 are formed, respectively. The land 34 is the same as that of the second embodiment.

According to the fifth embodiment, even in the hard disk drive 91 which is an example electronic apparatus, the fixing hole 36 can be located as close to the edges 35 as possible and hence a wide mounting area can be secured on the printed wiring board 51. This makes it possible to cope with the miniaturization of the printed wiring board 51 flexibly and to thereby miniaturize the hard disk drive 91 as a whole.

Although the printed wiring board 51 of the fifth embodiment is similar to that of the second embodiment, this aspect of the invention is not limited to such a case. That is, a printed wiring board similar to the printed wiring board of the first, third, or fourth embodiment may be used.

The electronic apparatus according to the invention is not limited to portable computers and hard disk drives, and the invention can also be applied to other kinds of electronic apparatus such as a cell phone. Other various modifications can be made of the above-described electronic apparatus without departing from the spirit and scope of the invention.

What is claimed is:

1. A printed wiring board comprising:
a substrate body comprising a straight edge portion and a fixing hole located adjacent to the straight edge portion, the fixing hole configured to receive a screw, the fixing hole located at a position excluding a corner portion of the substrate body;
a land provided at a position that is in a vicinity of the fixing hole and outside a region on the substrate body that extends along the straight edge portion and includes a portion between the fixing hole and the straight edge portion, the land comprising an area extending from the vicinity of the fixing hole and between a direction heading from the fixing hole to a central portion of the substrate body and a direction toward which the straight edge portion extends; and
a conductive plating portion covering an inner surface of the fixing hole, the plating portion being continuous with the land.

2. The printed wiring board of claim 1,
wherein the land is disposed at a position outside a second area proximal to the central portion.

3. A printed wiring board comprising:
a substrate comprising a straight edge and a fixing hole next to the straight edge, the fixing hole configured to receive a bolt, the fixing hole located at a position excluding a corner portion of the substrate;
a land in a vicinity of the fixing hole and extending in at least a first direction and a second direction, the first direction being a direction from the fixing hole toward a center of the substrate, the second direction being a direction along the straight edge; and
a conductive plating on an inner surface of the fixing hole, the plating being continuous with the land.

4. The printed wiring board of claim 3, wherein:
the substrate comprises a first region extending along the straight edge and comprising a band-shape, and
the land is outside the first region.

5. The printed wiring board of claim 4, wherein the land comprises a sector shape extending from the fixing hole toward the center of the substrate.

6. The printed wiring board of claim 4, wherein:
the substrate comprises a second region extending at least between the fixing hole and the center of the substrate, and
the land is outside the second region.

7. A printed wiring board comprising:
a fixing hole at a position near a straight edge and configured to accept a screw, the fixing hole located at a position excluding a corner portion of a substrate;
a land located at a position outside a region comprising an area between the fixing hole and the straight edge, the area located along the straight edge, the land comprising a portion extending from a vicinity of the fixing hole along the straight edge; and
a conductive plating portion covering an inner surface of the fixing hole, wherein the conductive plating portion is continuous with the land.

8. The printed wiring board of claim 7, wherein the portion extending from the vicinity of the fixing hole along the straight edge is positioned closer to the straight edge than the center of the fixing hole.

9. The printed wiring board of claim 8, further comprising:
a first face comprising the land; and
a second face that is opposite to the first face,
wherein the plating portion extends from the first face to the second face.

10. The printed wiring board of claim 7, wherein
the portion extending from a vicinity of the fixing hole further extends toward a center portion of the printed wiring board.

11. The printed wiring board of claim 10, further comprising:
a first face comprising the land; and
a second face that is opposite to the first face,
wherein the plating portion extends from the first face to the second face.

12. The printed wiring board of claim 11, further comprising:
a second land on the second face, the second land connected to the plating portion.

13. A printed wiring board comprising:
a substrate comprising a straight edge and a fixing hole next to the straight edge, the fixing hole located at a position excluding a corner portion of the substrate;
a partially annular land surrounding a portion of the fixing hole, the partially annular land comprising a first annular end and a second annular end aligned substantially in parallel to the straight edge, the partially annular land extending from the portion of the fixing hole in a direction heading from the fixing hole to a central portion of the substrate; and a conductive plating portion covering an inner surface of the fixing hole, the plating portion being continuous with the land.

14. The printed wiring board of claim 13, wherein the partially annular land comprises a 180 degree arc.

15. The printed wiring board of claim 13, further comprising at least one band-shaped region located between the land and the straight edge.

* * * * *